(12) United States Patent (10) Patent No.: US 8,608,376 B2
Kashyap et al. (45) Date of Patent: Dec. 17, 2013

(54) METHOD FOR MODELING AND PARAMETER EXTRACTION OF LDMOS DEVICES

(75) Inventors: Avinash S. Kashyap, Clifton Park, NY (US); H. Alan Mantooth, Fayetteville, AR (US)

(73) Assignee: Board of Trustees of the University of Arkansas, Little Rock, AR (US)

( * ) Notice: Subject to any disclaimer, the term of this patent is extended or adjusted under 35 U.S.C. 154(b) by 300 days.

(21) Appl. No.: 13/134,012

(22) Filed: May 26, 2011

(65) Prior Publication Data

US 2011/0292964 A1 Dec. 1, 2011

Related U.S. Application Data

(60) Provisional application No. 61/348,336, filed on May 26, 2010.

(51) Int. Cl.
*G01K 7/01* (2006.01)

(52) U.S. Cl.
USPC ............... 374/178; 374/170; 374/1; 702/130; 702/99; 257/288

(58) Field of Classification Search
USPC ............... 374/170, 178, 183, 4, 5, 45, 1, 184, 374/185, 57, 100, 163, 101; 702/130, 702/132–136, 99
See application file for complete search history.

(56) References Cited

U.S. PATENT DOCUMENTS

| 5,327,075 | A * | 7/1994 | Hashinaga et al. | 324/750.07 |
| 5,414,370 | A * | 5/1995 | Hashinaga et al. | 324/750.07 |
| 6,521,923 | B1 * | 2/2003 | D'Anna et al. | 257/288 |
| 6,759,902 | B2 * | 7/2004 | Kossor | 330/136 |
| 6,891,438 | B2 * | 5/2005 | Arai et al. | 330/296 |
| 7,268,045 | B2 * | 9/2007 | Hower et al. | 438/282 |
| 2003/0015767 | A1 * | 1/2003 | Emrick et al. | 257/528 |
| 2005/0242371 | A1 * | 11/2005 | Khemka et al. | 257/175 |
| 2006/0139896 | A1 * | 6/2006 | Bambridge et al. | 361/753 |
| 2008/0249743 | A1 * | 10/2008 | Hirohata et al. | 702/181 |
| 2009/0153171 | A1 * | 6/2009 | Lee et al. | 324/760 |
| 2010/0125377 | A1 * | 5/2010 | Kim et al. | 700/300 |
| 2010/0164525 | A1 * | 7/2010 | Han et al. | 324/760 |
| 2010/0262414 | A1 * | 10/2010 | Joshi et al. | 703/14 |

(Continued)

OTHER PUBLICATIONS

R. Berger, R. Garbos, J. Cressler, M. Mojarradi, L. Peltz, B. Blalock, W. Johnson, G. Niu, F. Dai, H.A. Mantooth, J. Holmes, M. Alles, P. McClusky, Miniaturized Data Acquisition System for Extreme Temperature Environments, 2008 IEEE Aerospace Conference, Mar. 2008, p. 1-12.

(Continued)

*Primary Examiner* — Gail Verbitsky
(74) *Attorney, Agent, or Firm* — Richard Blakely Glasgow

(57) ABSTRACT

A method for modeling the performance of a laterally diffused metal oxide semiconductor (LDMOS) device across a wide temperature range is disclosed. The method comprises the steps of positioning the device in an environment chamber operable to create a plurality of environment temperatures; connecting the pins of the device to a measurement system operable to measure at least one device characteristic; operating the environment chamber to set a series of four environment temperatures, acquiring a value of the device characteristic from the measurement system at each temperature, and extracting a temperature parameter set based on the value of the device characteristic at each temperature, then generating a temperature-scaling model for the device.

18 Claims, 14 Drawing Sheets

(56) References Cited

U.S. PATENT DOCUMENTS

2011/0210795 A1* 9/2011 Ohta et al. .................. 330/288
2012/0056636 A1* 3/2012 Shim et al. ............... 324/756.07
2012/0105166 A1* 5/2012 Darges ...................... 332/145

OTHER PUBLICATIONS

C.T. Aarts, W.J. Kloosterman, Compact Modeling of High-Voltage LDMOS Devices Including Quasi-Saturation, IEEE Transactions on Electron Devices, Apr. 2006, p. 897-902, vol. 53, No. 4.

C. Anghel, High Voltage Device for Standard MOS Technologies—Characterisation and Modelling, EPFL Lausanne, 2004.

M.N. Darwish, Study of the Quasi-Saturation Effect in VDMOS Transistors, IEEE Transactions on Electron Devices, 1986, p. 1710-1716, vol. ED-33, No. 11.

J. Evans, G. Amaratunga, The Behavior of Very High Current Density Power MOSFETs, IEEE Transactions on Electron Devices, 1997, p. 157-160, vol. 44, No. 7.

A.S. Kashyap, M. Mudholkar, H.A. Mantooth, T. Vo, M. Mojarradi, Cryogenic Characterization of Lateral DMOS Transistors for Lunar Applications, IEEE Aerospace Conference, Mar. 2009, p. 1-7, Big Sky, MT.

J. Jomaah, G. Ghibaudo, F. Balestra, Analysis and modeling of self-heating effects in thin-film SOI MOSFETs as a function of temperature, Solid-State Electronics, Mar. 1995, p. 615-618, vol. 38, No. 3.

I.M. Hafex, G. Ghibaudo, F. Balestra, M. Haond, Impact of LDD Structures on the Operation of Silicon MOSFETs at low temperature, Solid State Electronics, Feb. 1995, p. 419-424, vol. 38, No. 2.

D. Foty, Impurity Ionization in MOSFETs at Very Low Temperatures, Cryogenics, 1990, p. 1056-1063, vol. 30.

A.C.T. Aarts, A. Tajic, S.J. Sque, MOS Model 20, Level 2002.2, Unclassified Technical Note, NXP Semiconductors, May 2009, Eindhoven, Netherlands.

A. Akturk, J. Allnut, Z. Dilli, N. Goldsman, M. Peckerar, Device Modeling at Cryogenic Temperatures: Effects of Incomplete Ionization, IEEE Transactions on Electron Devices, Nov. 2007, p. 2984-2990, vol. 54, No. 11.

A. Schenk, P.P. Altermatt, B. Schmithusen, Physical model of incomplete ionization for silicon device simulation, Proc. SISPAD, 2006, p. 51-54.

Kyocera Standard Specification for Multilayer Dual in Line Packages, AS-1001 Rev. C.

A.S. Kashyap, H.A. Mantooth, T.A. Vo, M. Mojarradi, Compact modeling of LDMOS Transistors for Extreme Environment Analog Circuit Design, IEEE Transactions on Electron Devices, Jun. 2010, p. 1431-1439, vol. 57, No. 6.

F. Balestra, G. Ghibaudo, Device and Circuit Cryogenic Operation for Low Temperature Electronics, Kluwer Academic Publishers, 2001, p. 3-21.

* cited by examiner

Figure 12A
Figure 12B
Figure 12C
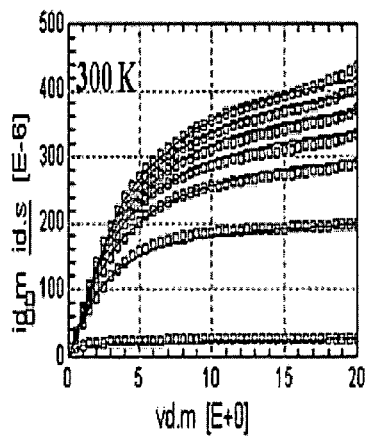
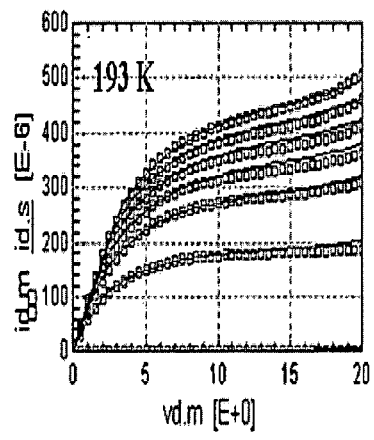
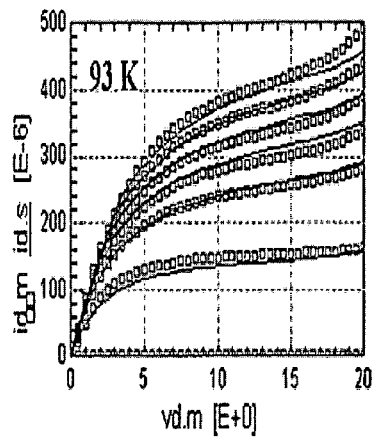
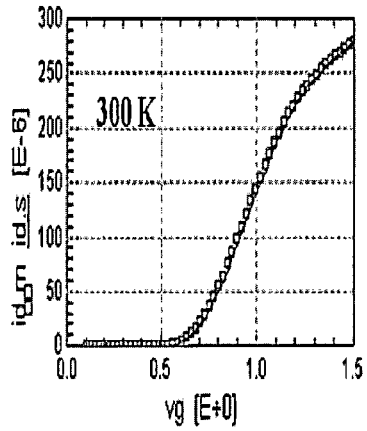
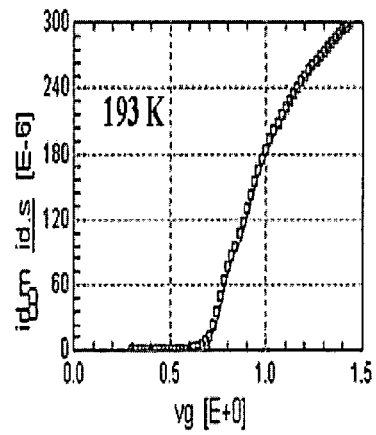
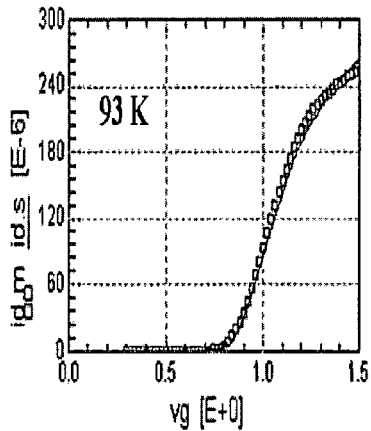
Figure 12D
Figure 12E
Figure 12F

METHOD FOR MODELING AND PARAMETER EXTRACTION OF LDMOS DEVICES

CROSS REFERENCE TO RELATED APPLICATIONS

This application claims the benefit of U.S. Provisional Application No. 61/348,336, entitled "Method for Modeling and Parameter Extraction of LDMOS Devices Under Cryogenic Conditions" and filed on May 26, 2010. The complete disclosure of said provisional patent application is hereby incorporated by reference.

STATEMENT REGARDING FEDERALLY SPONSORED RESEARCH OR DEVELOPMENT

Not applicable

BACKGROUND OF THE INVENTION

1. Field of Invention

The invention pertains to methods for modeling electronic device performance, and in particular to methods for modeling the performance of LDMOS devices.

2. Brief Description of Related Art

Accurate temperature scalable compact device models are the first steps towards designing extreme environment circuitry. Currently, designers utilize the standard models that are used to implement circuits in the 393 K to 218 K (+120° C. to −55° C.) range. Such models are not sufficient for applications that are to be deployed under deep cryogenic conditions (lunar, Martian etc.). The compact cryogenic model and the parameter extraction strategy is used to build high voltage biasing circuits for sensor interface electronics that are to be deployed in future lunar missions. These electronics are part of a remote health monitoring system-on-a-chip that monitors the conditions of surrounding key systems on a spacecraft [1]. This chip processes a wide variety of possible sensor inputs through an analog front end (Wheatstone bridge, variable gain amplifier, filtering, and data conversion). The electronics should be capable of operating down to 93 K (−180° C.) since they will not be shielded by "warm electronic boxes", which is the current practice. This will greatly reduce weight, volume, and power consumption, while improving overall performance and system reliability.

It would be erroneous to extrapolate the temperature scaling in standard models to such low cryogenic temperatures simply because the behavior at 93 K deviates significantly from what was observed at 218 K. One approach to address this problem is to use a standard model as an iso-thermal model by turning off the temperature dependent parameters and extracting a parameter set to fit at one single temperature. This can be repeated at various temperatures within the range. This binning method has many disadvantages: (a) effects such as self-heating will not be accounted for, (b) may not be very accurate if many temperature points are not considered, (c) cannot be used to design circuits that require a continuous replication of the device performance over the temperature range, (d) would require greater time and effort for realizing the design, and (e) the possibility of human errors increase as designers need to repeatedly switch between the various iso-thermal models used in their circuits depending on the temperature. It would therefore be desirable to have one model (and thereby, one parameter set) that can accurately replicate the behavior of the device over the entire temperature range. These limitations of the prior art are overcome by the present invention as described below.

BRIEF SUMMARY OF THE INVENTION

The present invention is directed to a new temperature scaling methodology wherein one parameter set can be utilized to accurately model the operation of the device across the entire temperature range. The invention, in various embodiments, is also capable of modeling other non-monotonic effects such as reliability, radiation effects, etc. The invention is further directed to a new parameter extraction methodology for the temperature scaling model wherein DC and CV parameters are extracted at multiple temperature points.

In one of its aspects, the invention is directed to a method for modeling the performance of a laterally diffused metal oxide semiconductor (LDMOS) device comprising a package and a plurality of connector pins, the method comprising the steps of positioning the device in an environment chamber operable to create a plurality of environment temperatures; connecting the pins of the device to a measurement system operable to measure at least one device characteristic; operating the environment chamber to set a first environment temperature, and acquiring a first value of the device characteristic from the measurement system; extracting a first temperature parameter set based on the first value of the device characteristic; operating the environment chamber to set a second environment temperature, and acquiring a second value of the device characteristic from the measurement system; extracting a second temperature parameter set based on the second value of the device characteristic; operating the environment chamber to set a third environment temperature, and acquiring a third value of the device characteristic from the measurement system; extracting a third temperature parameter set based on the third value of the device characteristic; operating the environment chamber to set a fourth environment temperature, and acquiring a fourth value of the device characteristic from the measurement system; extracting a fourth temperature parameter set based on the fourth value of the device characteristic; and generating a temperature-scaling model for the device based on the first, second, third and fourth temperature parameter sets. These and other features, objects and advantages of the present invention will become better understood from consideration of the following detailed description and drawings of the preferred embodiments.

BRIEF DESCRIPTION OF THE DRAWINGS

FIG. 10A shows input characteristics, FIG. 10B shows output characteristics, FIG. 10C shows transconductance, and FIG. 10D shows output conductance.

FIG. 11A is BET, FIG. 11B is RD, FIG. 11C is BETACC and FIG. 11D is THE3.

FIGS. 12A-F are graphs of the output (FIG. 12A-C) and input characteristics (FIGS. 12D-F) of the LDMOS device from 300° K to 93° K. For the output characteristics, $V_{gs}$ ranges from 0.7 to 3.1 V in steps of 0.4 V and the input characteristics were measured at a constant drain voltage of 15 V.

FIG. 17A shows output characteristics, FIG. 17B shows output conductance, FIG. 17C shows input characteristics, and FIG. 17D shows transconductance.

DETAILED DESCRIPTION OF THE INVENTION

Figure 1:
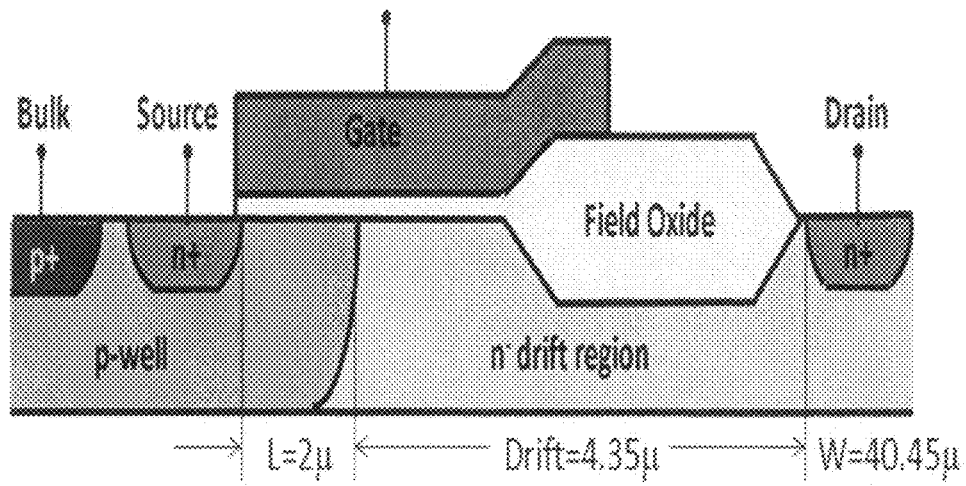
FIG. 1 is a cross-section of an LDMOS device.

Traditionally, high voltage operation has been realized in low voltage processes using circuit techniques. But these techniques increase both the complexity of the circuit and the power requirements. High voltage laterally diffused metal oxide semiconductor field effect transistor (LDMOS) devices make it possible to integrate low voltage circuits with high voltage parts instead of using discrete devices. The cross-section of the LDMOS device used in this research effort is shown in FIG. 1. The p-well bulk is diffused from the source side under the gate forming a graded-channel region. The device has a gate length of 2 μm and a width of 40.45 μm. To withstand the high voltages between the source and drain, the lightly doped drift region is long (4.35 μm) and it comprises two different sections—(i) the thin gate-oxide drift region and (ii) the thick-field-oxide drift region. The LDMOS device was implemented in IBM's 5AM SiGe BiCMOS technology [2] using custom layout techniques. Since the 5AM process is essentially for low voltage devices, the gate voltage of the LDMOS device is capped at a maximum of 3.3 V while the drain voltage could be 20V or higher, depending on the length and doping of the drift region. As this is a non-standard device, IBM does not provide models for it in the process design kit (PDK).

Figure 2:
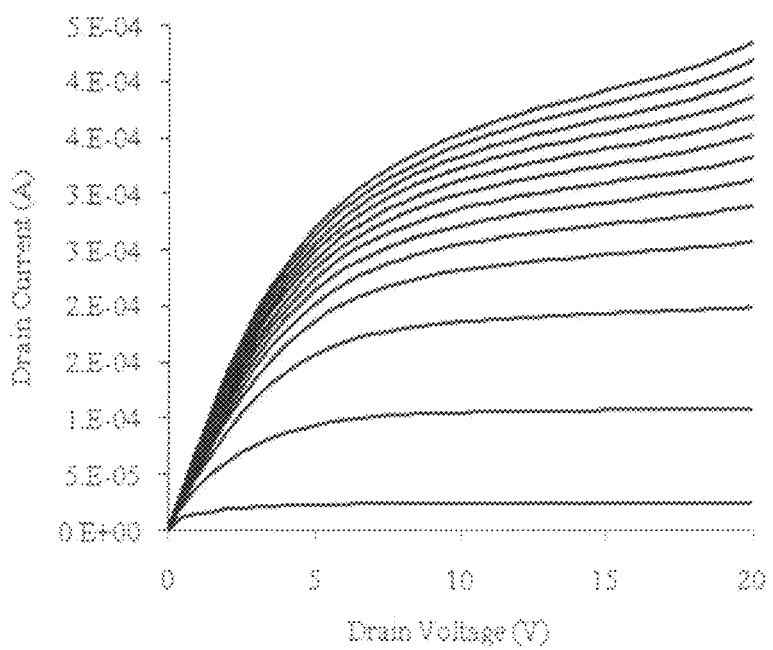
FIG. 2 is a graph of the output characteristics of the LDMOS device at 300 K ($V_{gs}$ ranging from 0.7 V to 3.1 V, in steps of 0.2 V).
Figure 3:
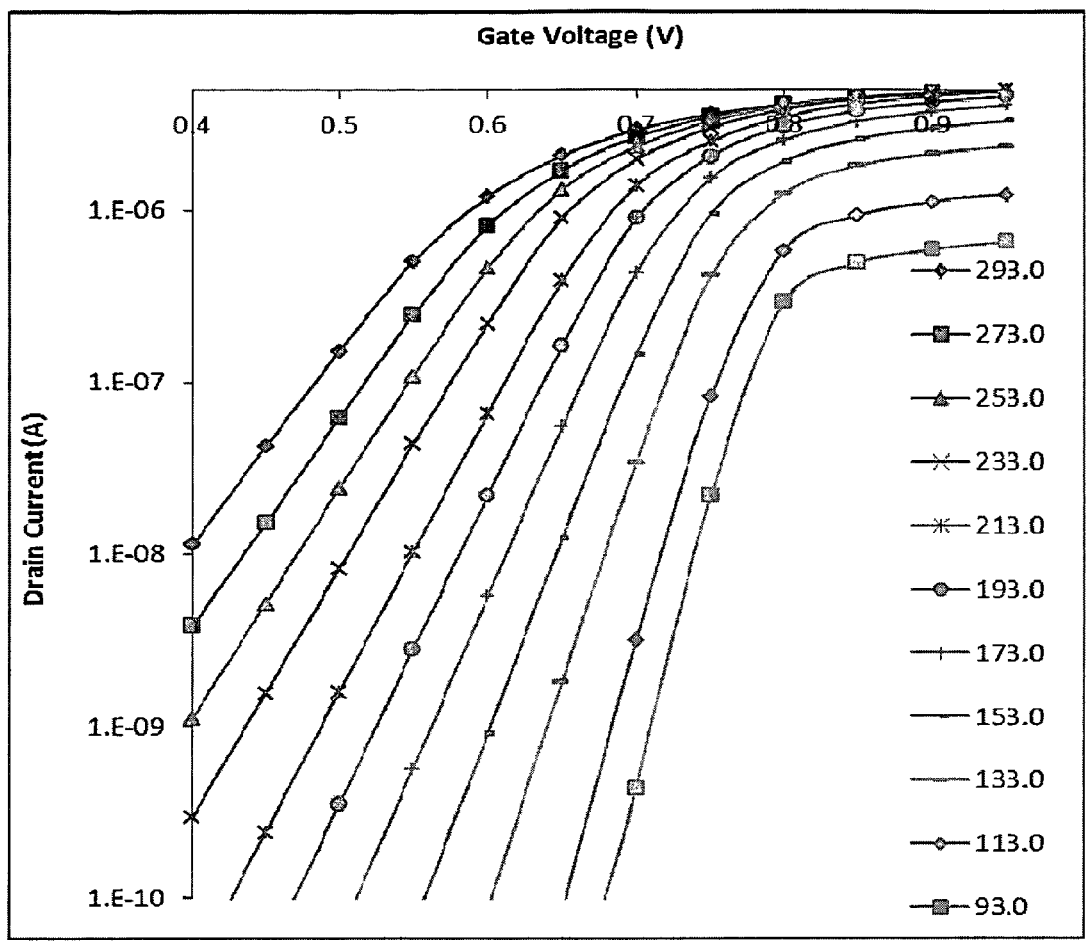
FIG. 3 is a graph of the LDMOS device from 300K to 93K (at $V_{ds}$=0.1 V for all temperatures).

When the gate bias exceeds the threshold voltage of the device, an inversion channel is created, and the carriers (electrons in this case) flow towards the lightly doped drift region. The gate extends over the drift region as seen in FIG. 1. When a positive bias is applied on the gate, electrons in the n-type drift region under the thin gate oxide get attracted to the surface and form an accumulation layer there. This provides continuity for the flow of electrons that originate in the inversion channel. Beyond a certain point in the thin gate-oxide drift region, depletion occurs and the accumulation layer vanishes. As a result, the electrons are gradually spread into the bulk region of the drift area. The electrons are spread over the entire drift region near the drain. The gate bias does not have much effect in controlling these electrons flowing in the bulk as the field oxide is very thick compared to the thin oxide region [3, 4]. One of the most distinguishing features of LDMOS devices is the presence of the quasi-saturation effect in the output characteristics. Quasi-saturation is manifested as the invariance of the drain current with increasing gate voltages as seen in FIG. 2. This is attributed to velocity saturation [5, 6] happening in the lightly doped drift layer of the device. The input characteristics of the device across the entire temperature range are shown in FIG. 3.

The packaged device was placed in an environment chamber that was fed with liquid nitrogen at 230 psi. This enabled the inventors to characterize the device from 300° K down to 93° K. For measuring the DC and CV characteristics, a Keithley 4200 [7] Semiconductor Characterization System was utilized. This guarantees high-resolution data that can be used for device studies and modeling. The device pins were connected to the external measurement system using BNC connectors.

All the necessary measurements such as input characteristics at high and low drain voltages, output characteristics and capacitance measurements were performed from 300° K to 93° K in 20° K intervals [8]. The capacitance values (measured at 1 MHz) were seen to vary negligibly with temperature. The parasitic capacitances due to the package were characterized using calibration test-structures included in the chip. They were then de-embedded from the C-V measurements of the device.

Figure 4:
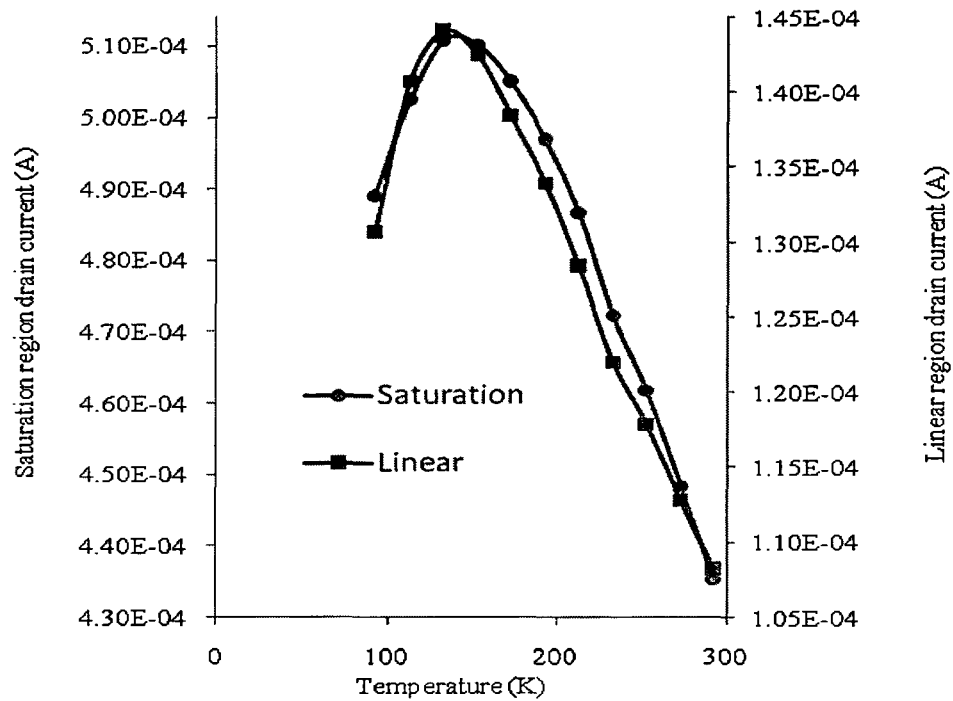
FIG. 4 is a graph of the output current in the saturation region (at $V_{ds}$=20 V) and the linear region (at $V_{ds}$=1.5 V) for $V_{gs}$=3.1 V.
Figure 5:
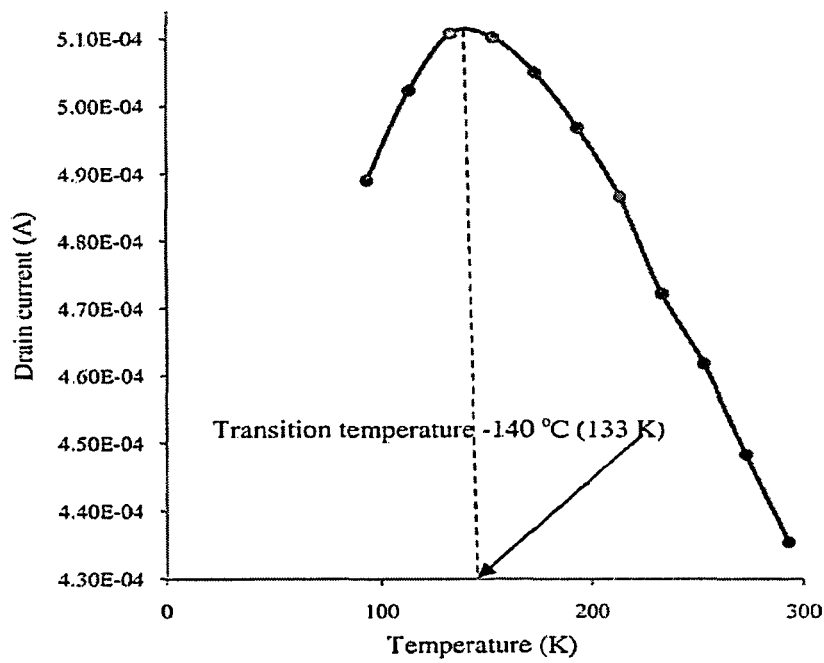
FIG. 5 is a graph of the output current at a gate bias ($V_{gs}$) of 3.1 V and drain voltage ($V_{ds}$) of 25 V at various temperatures.

The input characteristics of the device were along expected lines—i.e., the threshold voltage kept increasing as the temperature decreased. Also, as the temperature decreased, the drain current (in the output characteristics) increased as is expected in a MOS device. But when the temperature was reduced below 133° K, the output current started decreasing, as shown in FIGS. 4-5. Such non-monotonic behavior is extremely rare in MOSFETs and even more so at the relatively higher temperatures shown here at which the current starts falling. The device was packaged in the well characterized 40 pin ceramic dual in-line package from Kyocera [18]. The resistance associated with the package (wires, leads etc.) was de-embedded from the measurements. The parasitic package resistance (with known coefficients of temperature) varies linearly within the temperature range of interest and does not contribute to the current roll-off.

One plausible explanation for the above observations, especially for a high-voltage device is self-heating. But self-heating was conclusively ruled out as a cause due to the following reasons:

(i) Self-heating is manifested only in the saturation region of the output characteristics [9] when the higher current causes the device to heat up (due to local hot-spots, device design etc). In this case we see that the decrease in current is seen both in the linear and saturation regions (FIG. 4).

Figure 6:
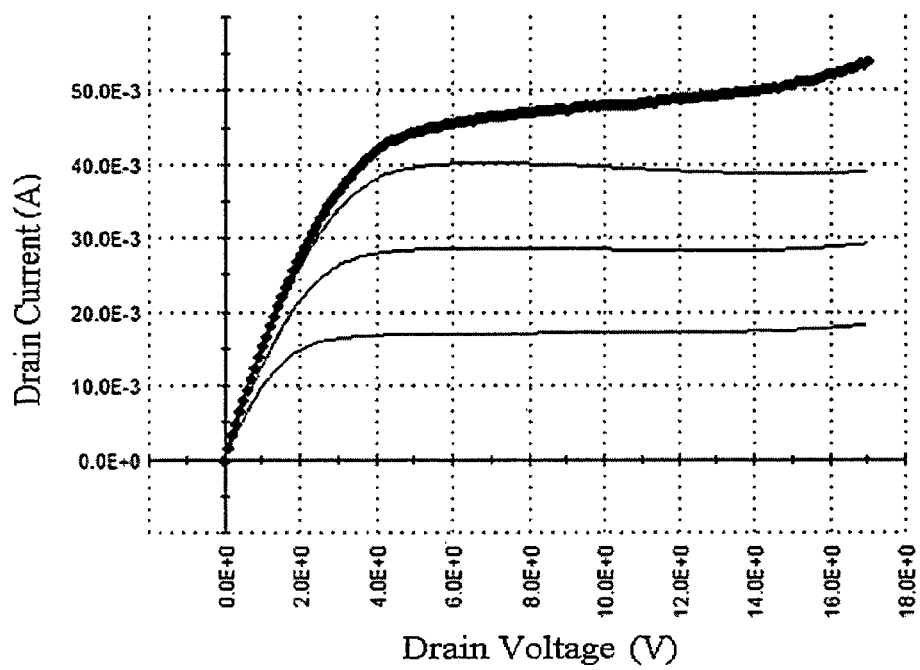
FIG. 6 is a graph measuring self-heating in an unrelated device measured at room temperature.

(ii) Devices that self-heat have the characteristic drooping curves [9] in the saturation region as seen in an unrelated device in FIG. 6 (second curve from the top). But, in the JPL-built LDMOS device, it is clear that the output characteristics do not droop (FIG. 2).

(iii) The device was initially measured using normal DC sweeps. The same measurements were then repeated using pulses (pulse width=0.1 μs, interval between pulses=40 μs) instead of DC sources, which would eliminate any self-heating, if present. The current values measured through both techniques were the same, indicating the absence of self-heating. In FIG. 6, the top-most curve shows the data when the measurement was pulsed, thereby isolating the self-heating phenomenon. No such issue was encountered in the JPL LDMOS.

It is postulated that impurity carrier freeze-out is the phenomenon that is causing the current to decrease at cryogenic temperatures [8]. Ionization energy is an important parameter in the operation of semiconductor devices. Dopants usually require some energy (usually thermal) to ionize and produce carriers in the semiconductor. If the temperature is too low, dopants will not be sufficiently ionized and there will be insufficient carriers, leading to freeze-out. Si MOSFETs can operate to the lowest temperatures because the carriers needed for conduction in the channel can be ionized by an electric field from the gate, known as field assisted impurity ionization [10, 11]. Si MOSFETs and CMOS circuits are often used at deep cryogenic temperatures, below the freeze-out of Si (<40° K) [12].

Figure 7:
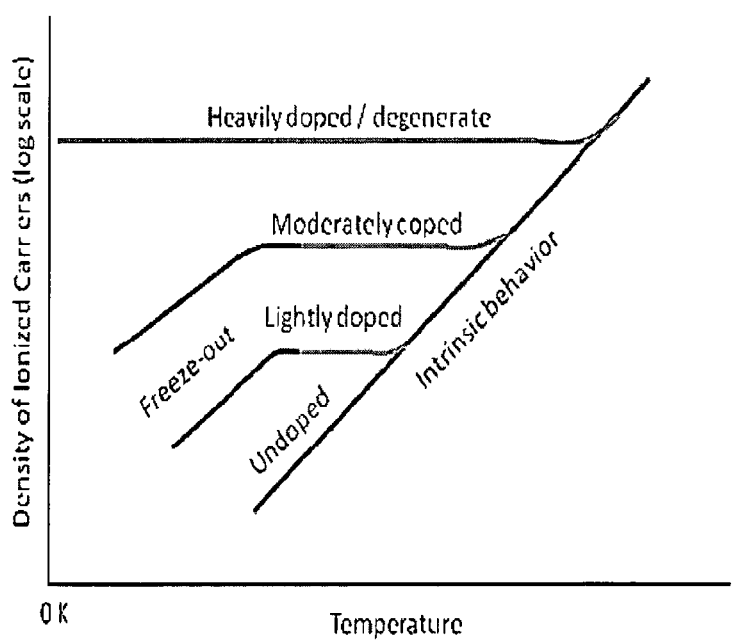
FIG. 7 is a graph showing ionized carrier concentration versus temperature in semiconductors.

But in LDMOS devices, the gate's electric field is shielded from the drift region, which is doped low (to increase breakdown voltage) to begin with. This creates lower ionization of carriers in the drift region as the temperature is decreased and we can therefore see the current considerably decreasing after a transition temperature. In FIG. 7, it is shown that lightly doped regions experience freeze-out even at relatively higher temperatures compared to highly or moderately doped regions. Therefore, the freeze-out begins in the drift layer of the device and consequently the output current keeps falling. There is a risk of these devices completely freezing-out in temperatures that normal MOSFETs continue to work. This fact has to be borne by circuit designers who use both LV and HV devices in their design. While the LV devices would continue to function as expected in low cryo temperatures, the HV devices would start to freeze-out and this has to be reflected in the models for an accurate, reliable design. The transition temperature can possibly be lowered by appropriate device design changes. The freeze-out effects are also manifested in the input characteristics as the apparent decrease in the current in strong inversion when the temperature decreases to low values (FIG. 3).

Standard compact models do not have temperature scaling equations that can replicate this freeze-out effect. Therefore, there are no reliable means to predict the non-monotonic behavior of the output current in LDMOS devices.

MOS Model 20[13] is a surface potential based model for asymmetric lateral MOS devices that can replicate the effects due to the drift region without the necessity for a series external resistor in a sub-circuit configuration. MOS Model 20 may be implemented as software that is compiled from source code and run on a traditional desktop general-purpose computer. MM20 was chosen for this research project because it has been shown to successfully model HV LDMOS devices to a great level of accuracy [3]. The equations and the source code were fairly mature and the model was available (in Verilog-A) for modifications at the time this project began. Moreover, the temperature scaling equations are neatly decoupled from the core DC and CV model—which makes understanding and modifying the model easier.

Figure 8A:
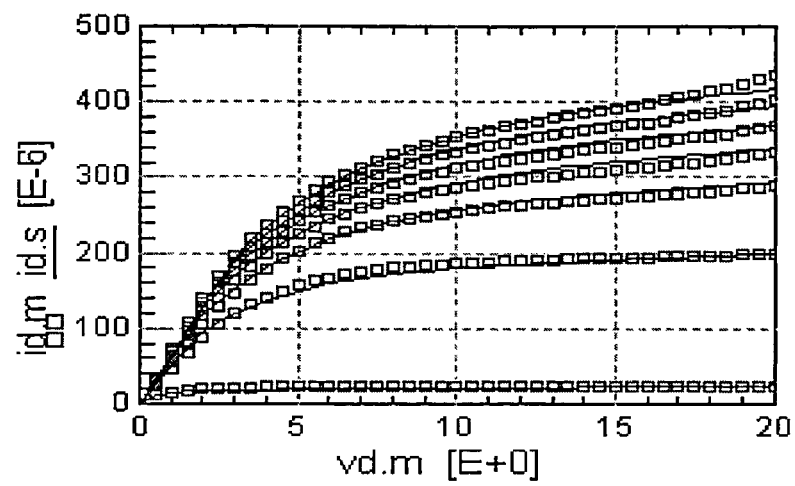
FIG. 8A is a graph of the output characteristics of the device at 300° K and FIG. 8B is a graph of output characteristics at 93° K after iso-thermal parameter extraction.
Figure 8B:
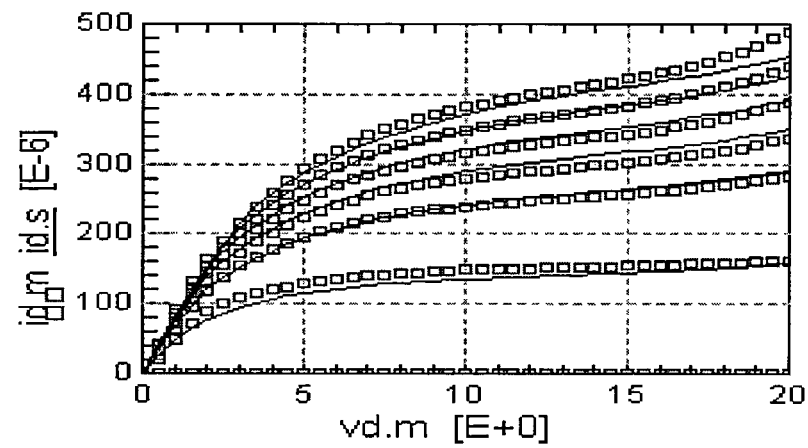

To gauge the capability of the temperature scaling in the MM20 model, iso-thermal parameter extractions were performed for the LDMOS device from 300 K to 93 K in steps of 20 K. Self-heating was turned off in the model during this process. Some representative fits obtained from the iso-thermal extractions can be seen in FIGS. 8A-B. The dots are the measured data and the lines are the model. The gate voltage ranges from 0.7 V to 3.1 V in steps of 0.4 V.

The parameter extraction was performed on the input ($I_d$-$V_{gs}$) and output characteristics ($I_d$-$V_{ds}$) along with the output conductance ($g_{ds}$) for each temperature data point. The capacitance parameters were extracted before the DC extraction was performed. The simulation results have an excellent agreement with the data, including in the quasi-saturation region—which is a very challenging area to model in LDMOS devices.

Figure 9:
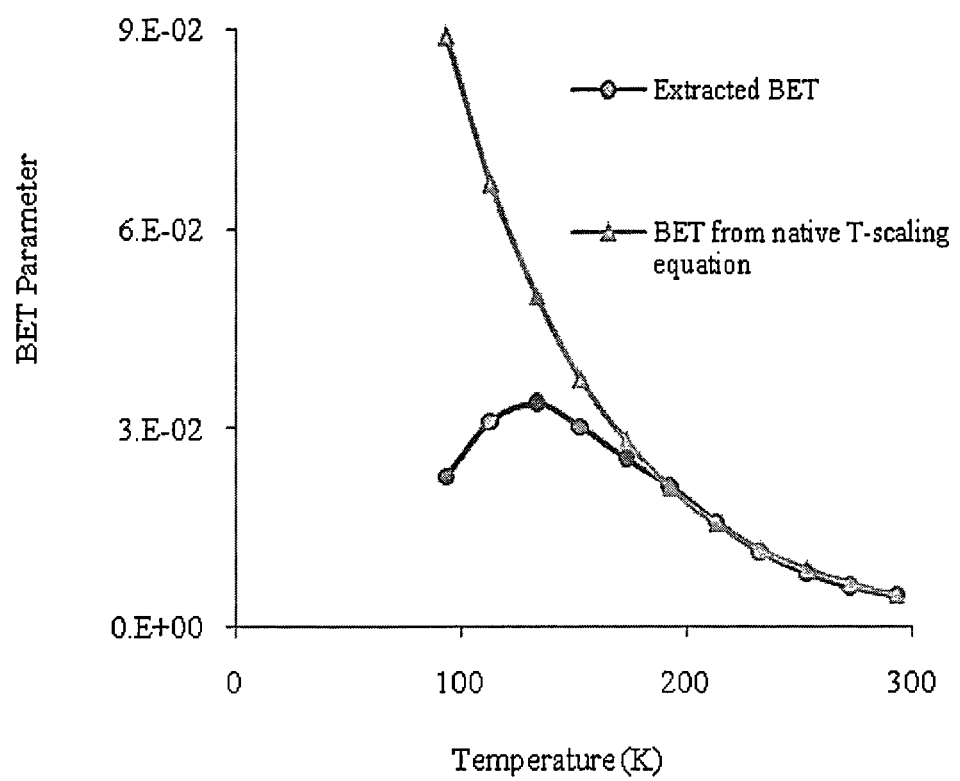
FIG. 9 is a graph comparing iso-thermally extracted BET with BET calculated from the native MM20 model.
Figure 10A:
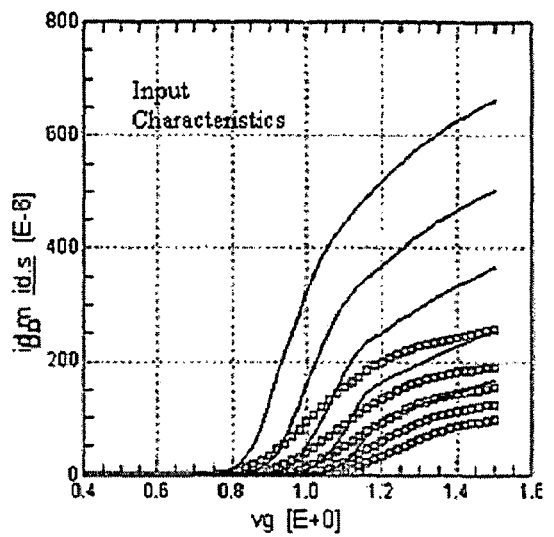
FIGS. 10A-D are graphs of the performance of the MOS20 model at 93° with the native T-scaling equations.
Figure 10B:
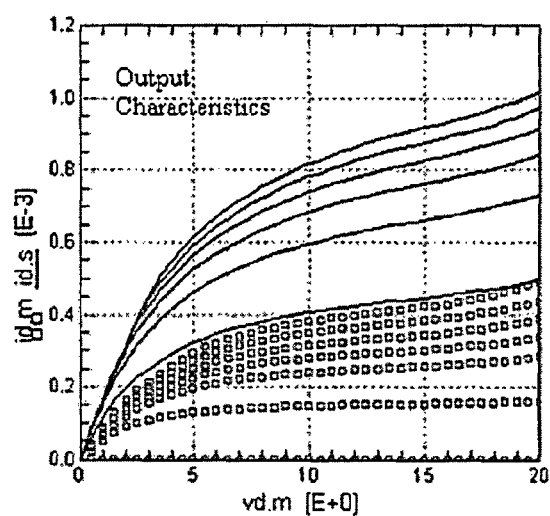
Figure 10C:
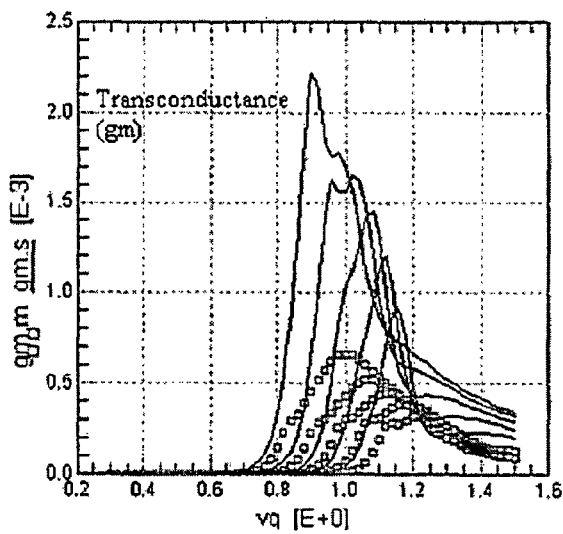
Figure 10D:
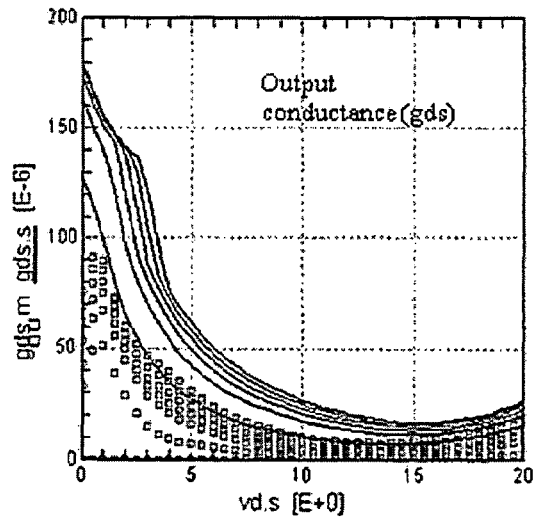
Figure 11A:
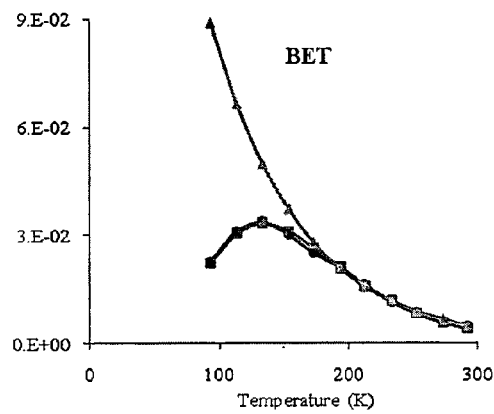
FIGS. 11A-D are graphs comparing iso-thermally extracted parameters with the values calculated from the new T-scaling equations.
Figure 11B:
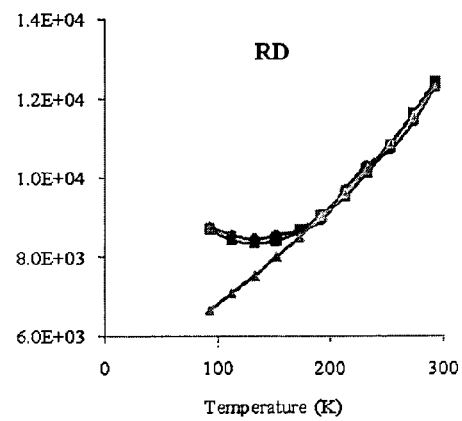
Figure 11C:
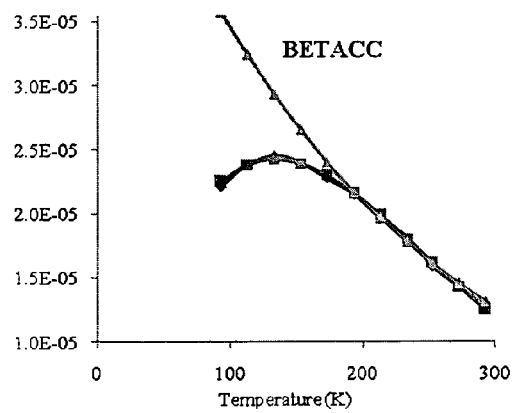
Figure 11D:
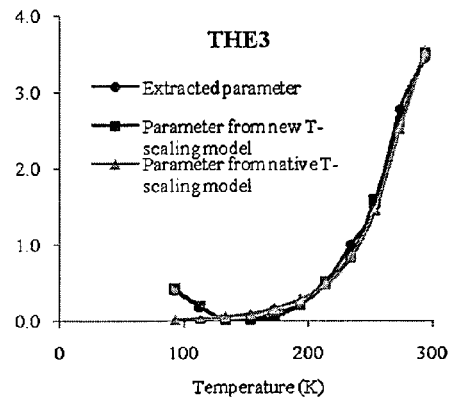

One important point to be noted here is that the MM20 measurement procedure (and hence the parameter extraction guide) provided by NXP Semiconductors is not directly applicable to this device because of its unique specifications. For example, as per the MOS Model 20 manual [13], the IDVD measurement entails stepping the gate voltage from $V_T$+0.1 V to $V_T$+3.1 V. For this device, it would not be feasible to step the gate voltage up to ~4 V when the maximum allowed gate voltage is only 3.3 V. Moreover, certain model parameters such as MEXP, MEXPD, CGSO, and CGDO were not included in the extraction procedure. Therefore, changes needed to be made to the parameter extraction guide to accommodate these requirements. At the end of the iso-thermal extractions, all the extracted temperature dependent parameters were plotted. Some of them include BET (gain factor of the channel region at the reference temperature, $T_{ref}$), BETACC (gain factor for the accumulation layer in the drift region), RD (on-resistance of the drift region), THE3 (mobility reduction coefficient in the channel region due to the horizontal electric field caused by velocity saturation), and PHIB (surface potential at the onset of strong inversion in the channel region). These plots were then superimposed with the same parameters calculated by the temperature scaling equations (FIG. 9). For instance, in the native MM20 model, the temperature scaling of the parameter BET is given as a simple exponential [13];

$$\beta_T = \beta_i \cdot Tr^{ETABET} \quad (1)$$

where $\beta_i$ is the BET extracted at $T_{ref}$, $n_\beta$ (ETABET) is the temperature scaling exponent (a parameter) and Tr is the normalized temperature. It can be clearly seen in FIG. 9 that the native model would grossly over-estimate the value of BET in lower cryogenic temperatures as it does not account for carrier freeze-out. Similarly, over-(or under) estimation of the values are also observed with the other temperature dependent parameters. In low cryo temperatures, since most of the processed parameter values are incorrect, the output current is also erroneous as seen in FIGS. 10A-D.

The above shortcomings clearly demonstrate the need for improved temperature scaling equations that would render the model useful for circuit design in deep cryogenic temperatures.

"Physical" models (even though they have some arbitrary fitting coefficients) for impurity freeze-out are finite-element based and require at least a one dimensional device simulator to predict the results [15-16]. This is not a practical solution for compact modeling where speed and convergence are extremely important factors. Moreover, such numerical models require intimate knowledge of the process and materials used in the construction of the device—information that is difficult to obtain from the manufacturers. Therefore, temperature scaling in compact models is generally semi-empirical.

In the MM20 model, the temperature dependence equations are decoupled from the core model. In other words, temperature parameters and equations process those parameters that are used in the DC and AC model. For example, the simplified expression for the channel region current is [13]:

$$I_{ch} = \beta_T \cdot V_{int1}/(F_{mob} \cdot (1+\theta_3 \cdot V_{Di})) + G_{min} \cdot k_0^2 \cdot V_{Di} \quad (2)$$

$$F_{mob} = 1 + \theta_1 \cdot V_{int2} + \theta_2 \cdot V_{int3}/k_0 \quad (3)$$

In the above equations, $G_{min}$ is a constant, parameter $k_o$ (KO) is the body factor of the channel region, parameters $\theta_1$ (THE1) and $\theta_2$ (THE2) are mobility reduction coefficients due to the vertical electrical field, while $\theta_3$ (THE3) is the mobility reduction coefficient due to the horizontal field. $V_{int1}$, $V_{int2}$ and $V_{int3}$ are internally calculated voltages. It can be seen that temperature dependence is not directly implemented in the above equations. Only the parameters that are used in the core equations are made to track with temperature. Therefore, the model can be suitably enhanced for extreme environment operation by modifying the temperature scaling equations of the parameters that track with temperature.

The native MM20 model has either linear or simple exponential functions to describe the trend of the variation of the temperature dependent parameters; which works down to about 170 K for this device, but fails below that. Freeze-out in compact modeling terms can be visualized as the decrease in mobility (at inversion in channel and accumulation in drift region) and the consequent increase in the drift resistance beyond the transition temperature. Various mathematical functions were evaluated to describe this non-monotonic behavior. A modified form of the equation that defines the probability density function (pdf) of the Gumbel distribution [14] was finally chosen as it can replicate the behavior accurately without any requirement for piecewise relations or weighting functions. This will simplify both parameter extraction and model convergence. Since a parameter's value can be greater than one, the normalization of the pdf is replaced by a user defined parameter as shown in equation (4)—for BET, where BETTMP is $\beta_{tmp}$ and EBETTMP is $e^{-BETTMP}$:

$$\beta_T = EBETTMP \cdot e^{-EBETTMP}/\beta_{mult} \quad (4)$$

$$\beta_{tmp} = (T_A - T_T)/\beta_i \beta_{EXP} \quad (5)$$

In the above equations, $T_A$ is the ambient temperature and $T_T$ is the freeze-out transition temperature. The ETABET parameter in the native model has been replaced by two new parameters—BETEXP ($\beta_{EXP}$) and BETMULT ($\beta_{MULT}$). BETEXP is defined as the scaling coefficient for BET and BETMULT is the temperature exponent of BET. With the new equation, BET varies with temperature as shown in FIGS. 11A-D. The incorporation of parameters such as the transition temperature and the consequent non-monotonic behavior of the parameter provides a more physical meaning to the temperature scaling equations than what was present in the native model. Equation (1) in the native model was then replaced with the newly developed equations (4) and (5) and their associated parameters.

In a similar way, the temperature scaling of the drift region resistance is also illustrated below. In the native model, the drift region resistance is scaled as:

$$RDT = RD \cdot T_T^{ETARD} \quad (6)$$

where DT is $D_T$, RDT is $R_{DT}$, RD is $R_D$, and ETARD is $\eta_{RD}$.

This equation was then modified as:

$$RDT = ERDTMP \cdot e^{-ERDTMP}/RDMULT + RDMULT \quad (7)$$

$$RDTMP = (T_A - T_T)/RD \cdot RDEXP \quad (8)$$

where RD is $R_D$, DTMP is $D_{tmp}$, RDTMP is $R_{DTMP}$, and ERDTMP is $e^{-RDTMP}$ The ETARD ($\eta_{RD}$) parameter in the native model is replaced by RDEXP (the first-order scaling coefficient of RD) and RDMULT (the temperature exponent of RD). The results of RD scaling and of some other representative parameters are also shown in FIGS. 11A-D. Note that the newly developed equations are able to replicate the temperature scaling of the parameters very accurately. The performance of the native temperature scaling equations are also overlaid on the figures for comparison.

Other parameters such as PHIB had a linear variation over the temperature range and the built-in equations were therefore sufficient for lower cryo operation. The temperature scaling equations of the native MM20 Verilog-A model were then replaced with the newly developed equations using the ModLyng tool [17]. The new model has 12 new parameters for temperature dependencies. This modified model was then compiled for Spectre and simulated, using a standard desktop computer, the results of which can be seen in FIGS. 12A-F.

Figure 13:
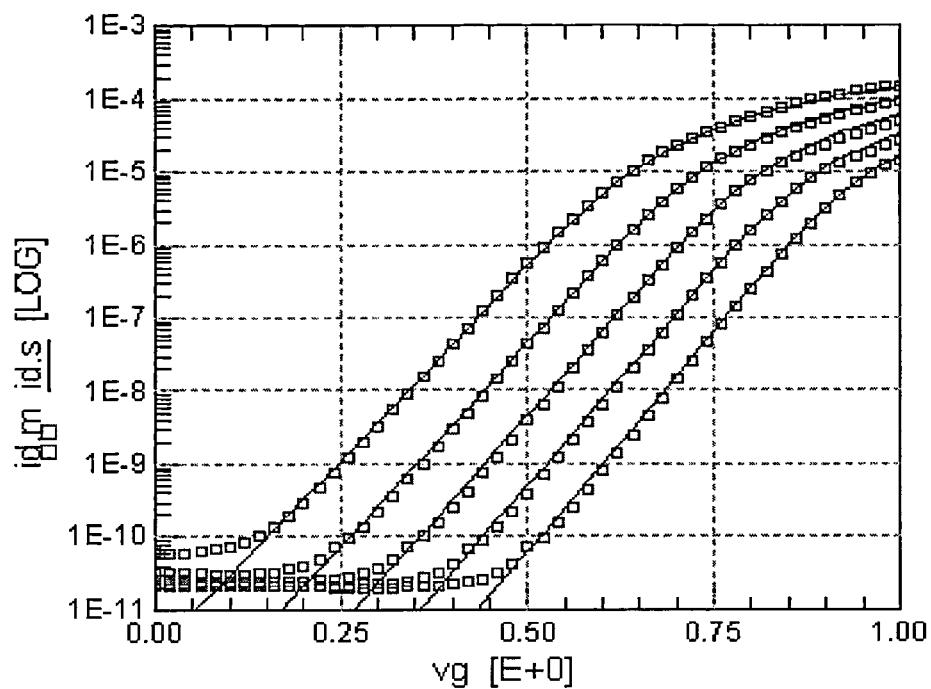
FIG. 13 is a graph of the sub-threshold characteristics measured and simulated with back-bias ranging from 0 V to −1 V and $V_{ds}$=0.1 V and 300° K.
Figure 14:
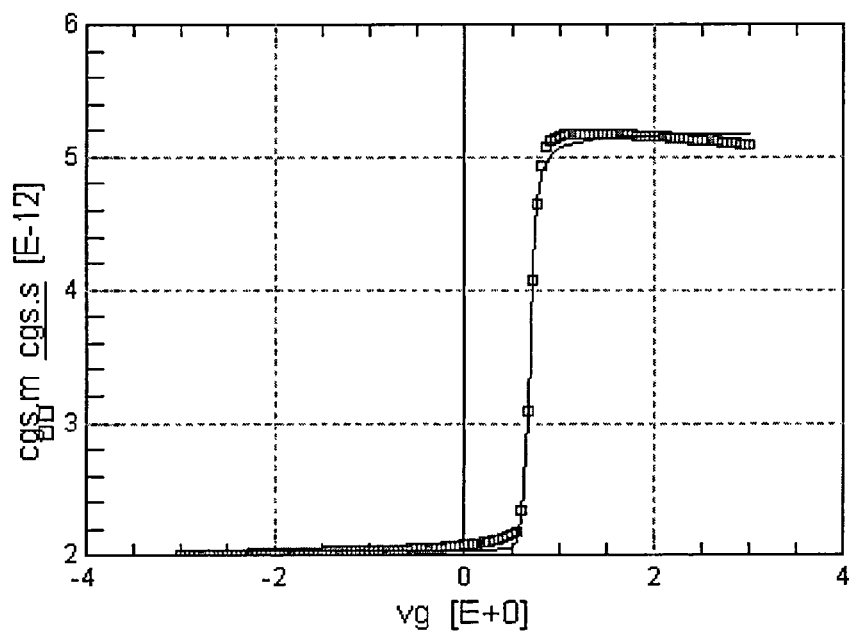
FIG. 14 is a graph of $C_{gs}$ characteristics measured and simulated at 93° K.
Figure 15:
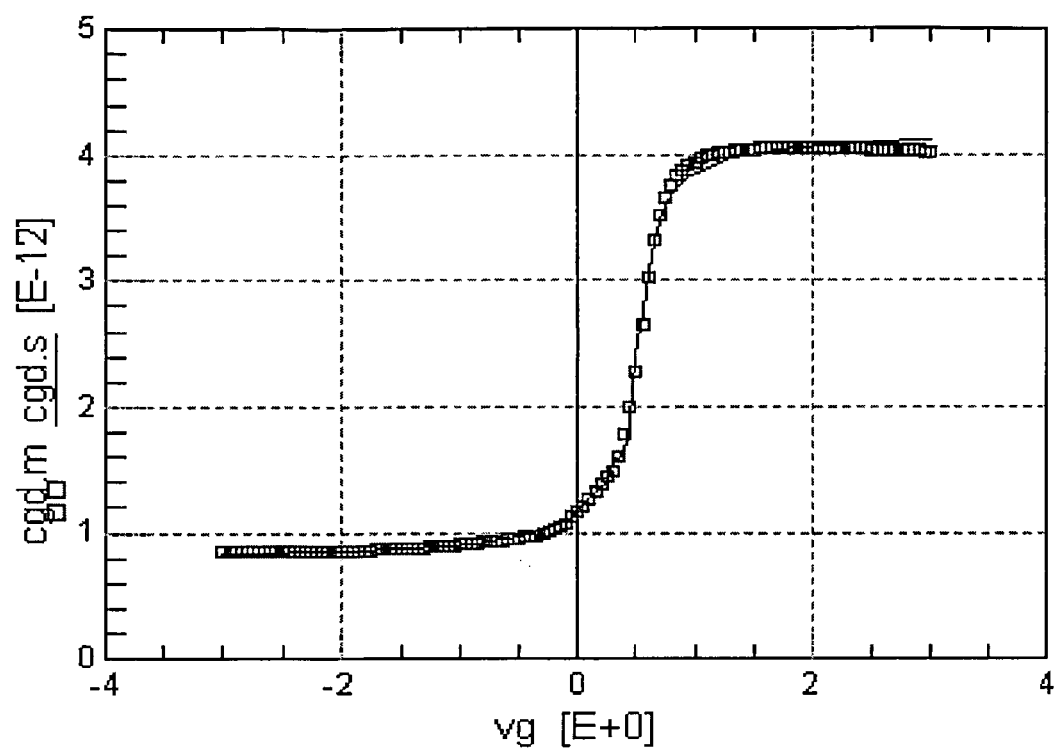
FIG. 15 is a graph of $C_{gd}$ characteristics measured and simulated at 93° K.

The model with the newly developed equations is extremely accurate (error <1-2%) over the entire temperature range. As shown in FIG. 13, it also performs exceptionally well in the sub-threshold region (including back-bias) and in the C-V regimes (FIGS. 14 and 15). There were no changes in the model simulation times or convergence properties. This model can be used to extend the temperature scaling behavior until the device fails (in both high and low temperature conditions).

As previously mentioned, the parameter extraction guide of the MM20 model is not directly applicable to this device due to its unique specifications. For this particular device, since $V_{gs,max}$ is only 3.3 V, there is significant overlap between the IDVD and IDVDH measurements. Therefore, only one of these measurements was performed (with several $V_{gs}$ steps from the threshold voltage, $V_T$ to $V_{gs,max}$) from which all the parameters related to the output characteristics were extracted. The smoothing factor, MEXP should also be extracted along with the channel length modulation parameters (ALP, VP). A new step was then added to extract the gain parameter in accumulation (BETACC) along with the drift region resistance (RD) and the smoothing factor for the linear to quasi-saturation regime (MEXPD) from the same measurement. The transition temperature when the output current starts rolling off has now been added as a parameter for modeling LDMOS devices that experience freeze-out and it has to be measured accurately from the output characteristics.

Once a complete set of parameters is extracted at room temperature, the relevant temperature scaling parameters can now be introduced in the same extraction procedures at different temperatures. Since the LDMOS temperature behavior is non-monotonic, greater accuracy can be achieved by using 4 or more temperature points (i.e. at room temperature, at the upper bound temperature, at the transition temperature and finally one more data point below the transition temperature where the current rolls-off). For example, RDEXP and RDMULT should be extracted from the step in which RD was extracted, by keeping RD constant at different temperatures simultaneously. In other words, only by optimizing the temperature scaling factors, can the device be modeled at other temperatures too. Greater weight may be provided to the extraction at lower temperatures for enhanced accuracy, if the circuits designed with the model are to be primarily used in deep cryogenic conditions. A global fine-tune may also be performed towards the end of the extraction to the temperature scaling parameters for better optimization.

An alternate method would be to extract the DC and AC parameters iso-thermally (as described previously) at four different temperatures—room temperature, upper bound, lower bound and transition temperature. The base parameters are then fitted to the new scaling equation using an external program such as MATLAB to extract the temperature scaling parameters. This method is less automated, but it entails lower optimization time and can therefore be used for quick turnarounds.

Figure 16A:
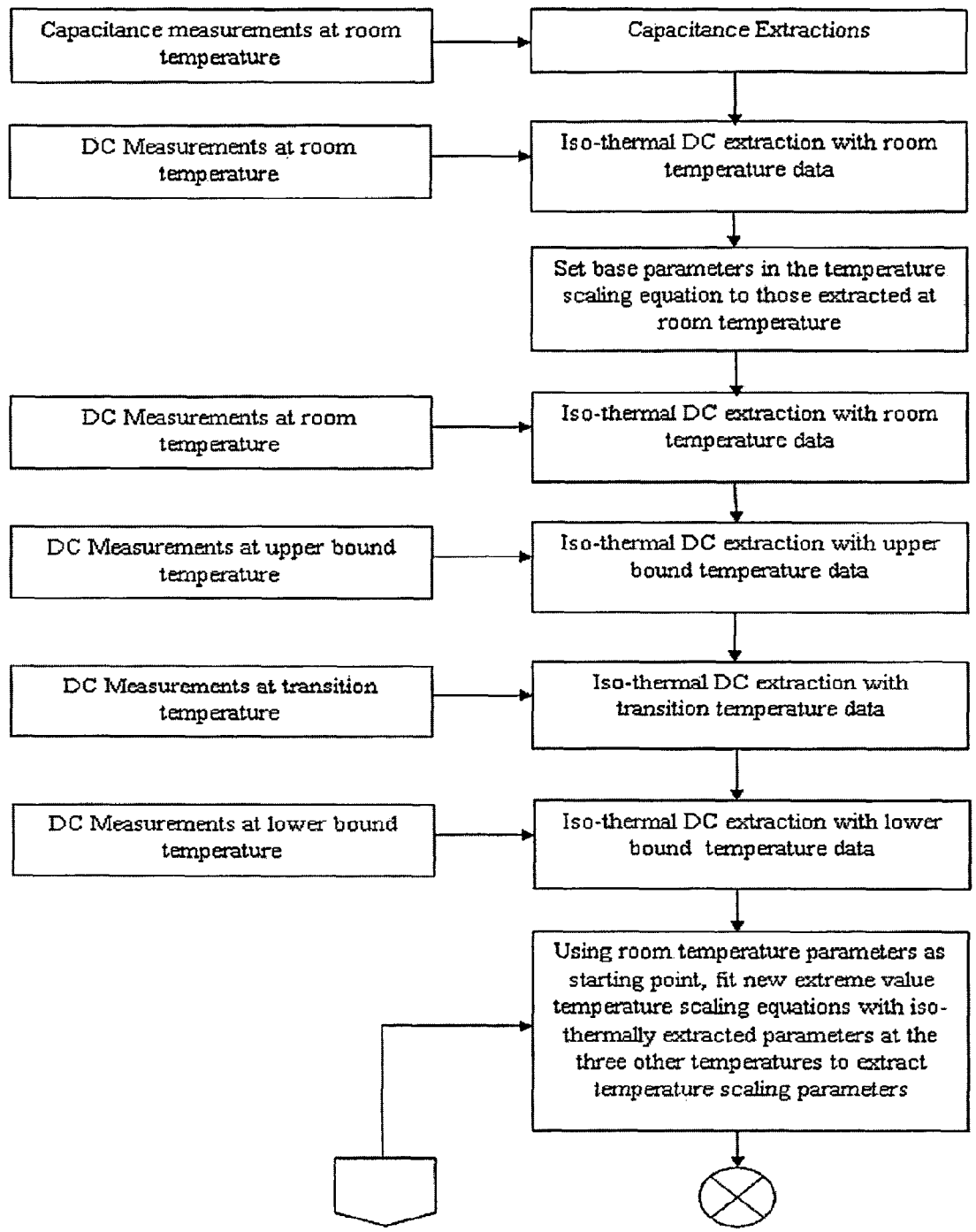
FIGS. 16A and B together comprise a flowchart outlining the new parameter extraction strategy utilizing the novel temperature scaling equations for LDMOS devices in the cryogenic regime.
Figure 16B:
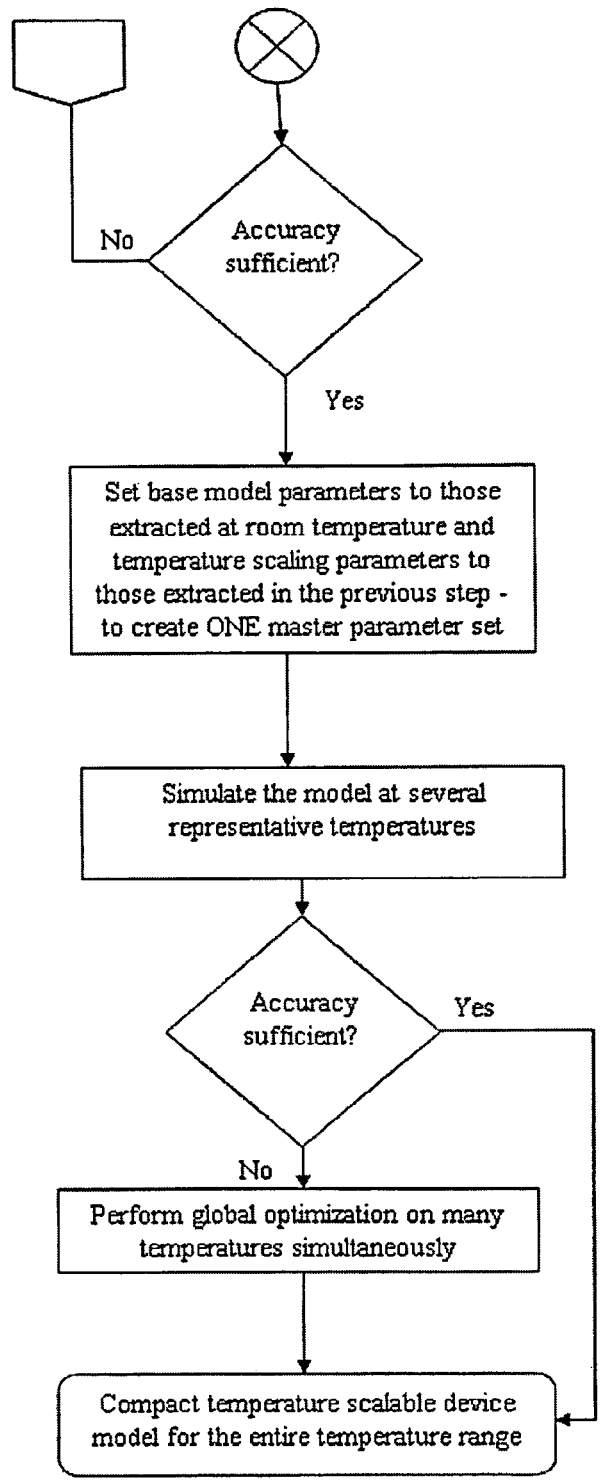
Figure 17A:
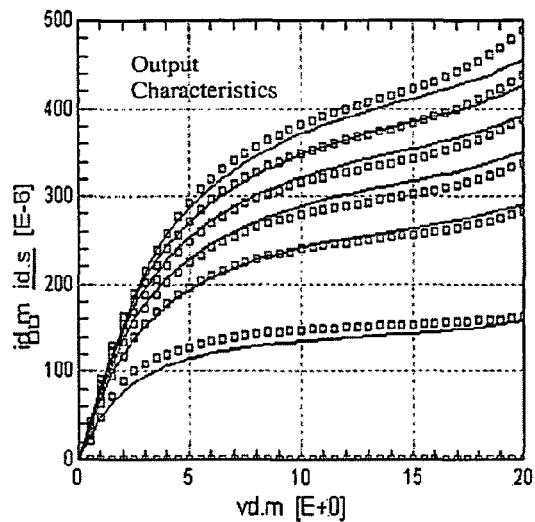
FIGS. 17A-D are graphs of the performance of the LDMOS model at −180° C. with the new temperature scaling equations.
Figure 17B:
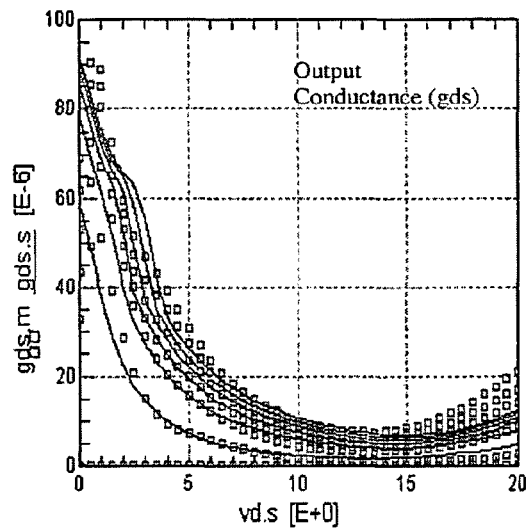
Figure 17C:
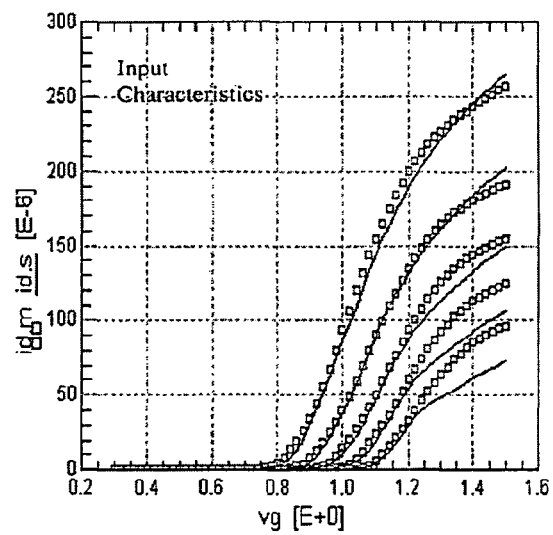
Figure 17D:
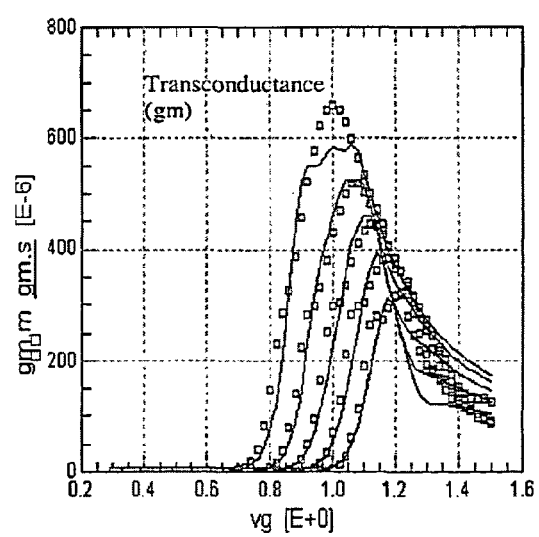

The parameter extraction methodology can be visualized in the form of the flowchart shown in FIG. 16A-B. The model with the new temperature scaling equations is able to accurately model the operation of the device over the entire temperature range with a single parameter set. The performance at −180° C. is shown in FIG. 17A-D, which when compared to FIGS. 10A-D prove the effectiveness of the newly developed equations and the parameter extraction strategy.

There are many advantages of using these newly developed equations and the associated extraction methodology: (a) temperature modeling becomes much easier and intuitive, (b) the circuit designer need not switch between different model files depending on the temperature, (c) makes its possible to design circuits such as bandgap references for extremely low temperatures as a continuous description of model performance is available through this method vis-à-vis the binned model technique.

These equations can be implemented for temperature scaling in any compact model and are not restricted to the MOS Model 20. The equations may also be used to model any behavior that is non-monotonic. In other words, the applications of the equation are not restricted to temperature modeling—but can also be used for modeling radiation effects, reliability, ageing of semiconductor devices, among others.

The present invention has been described with certain preferred and alternative embodiments that are intended to be exemplary only and not limiting to the full scope of the invention.

The following are incorporated herein by reference:

REFERENCES

[1] R. Berger, R. Garbos, J. Cressler, M. Mojarradi, L. Peltz, B. Blalock, W. Johnson, G. Niu, F. Dai, H. A. Mantooth, J. Holmes, M. Alles, P. McClusky, "Miniaturized Data Acquisition System for Extreme Temperature Environments," 2008 IEEE Aerospace Conference, pp. 1-12, 1-8 Mar. 2008.

[2] SiGe5AM Model Reference Guide, IBM Corporation, Hopewell Junction, N.Y. 12533, September 2002.

[3] A. C. T. Aarts and W. J. Kloosterman, "Compact Modeling of High-Voltage LDMOS Devices Including Quasi-Saturation," IEEE Trans. Electron Devices, Vol. 53, No. 4, April 2006 pp. 897-902.

[4] C. Anghel, "High Voltage Device for Standard MOS Technologies—Characterisation and Modelling," Ph.D Dissertation, EPFL Lausanne, 2004.

[5] M. N. Darwish, "Study of the Quasi-Saturation Effect in VDMOS Transistors" IEEE Trans. Electron Devices, Vol. ED-33, No. 11, pp. 1710-1716, 1986.

[6] J. Evans, G. Amaratunga, "The Behavior of Very High Current Density Power MOSFETs", IEEE Trans. Electron Devices, Vol. 44, No. 7, pp. 1148-1153, 1997.

[7] Keithley 4200 Semiconductor Characterization System User Manual, Keithley Inc., Cleveland, Ohio 44139.

[8] A. S. Kashyap, M. Mudholkar, H. A. Mantooth, T. Vo, M. Mojarradi, "Cryogenic Characterization of Lateral DMOS Transistors for Lunar Applications," IEEE Aerospace Conference, Big Sky, Mont., March 2009.

[9] J. Jomaah, G. Ghibaudo and F. Balestra, "Analysis and modeling of self-heating effects in thin-film SOI MOSFETs as a function of temperature," Solid-State Electronics Vol. 38, Issue 3, pp. 615-618, March 1995.

[10] I. M. Hafez, G. Ghibaudo, F. Balestra and M. Haond, "Impact of LDD Structures on the Operation of Silicon MOSFETs at low temperature," Solid State Electronics, Vol 38, Issue 2, pp. 419-424, February 1995.

[11] D. Foty, "Impurity Ionization in MOSFETs at Very Low Temperatures," Cryogenics, Vol. 30, pp. 1056-1063, 1990.

[12] F. Balestra and G. Ghibaudo, Device and Circuit Cryogenic Operation for Low Temperature Electronics, Kluwer Academic Publishers, 2001.

[13] A. C. T. Aarts, A. Tajic, and S. J. Sque, "MOS Model 20, Level 2002.2," Unclassified Technical Note, PR-TN-2005/00406, NXP Semiconductors, Eindhoven, Netherlands, May 2009.

[14] M. Evans, N. Hastings, B. Peacock, Statistical Distributions, Wiley-Interscience, 3 edition, 2000.

[15] A. Akturk, J. Allnutt, Z. Dilli, N. Goldsman, M. Peckerar, "Device Modeling at Cryogenic Temperatures Effects of Incomplete Ionization," IEEE Trans. Electron Devices, Vol. 54, No. 11, November 2007, pp. 2984-2990.

[16] A. Schenk, P. P. Alternatt, and B. Schmithusen, "Physical model of incomplete ionization for silicon device simulation," in Proc. SISPAD, 2006, pp. 51-54.

[17] ModLyng is a registered trademark of Lynguent Inc., Portland, Oreg.

[18] Kyocera Standard Specification for Multilayer Layer Dual In Line Packages (AS-1001, Rev. C)

We claim:

1. A method for modeling the performance of a laterally diffused metal oxide semiconductor (LDMOS) device comprising a package and a plurality of connector pins, the method comprising the steps of:
   a. positioning the device in an environment chamber operable to create a plurality of environment temperatures;
   b. connecting at least one of the pins of the device to a measurement system operable to measure at least one device characteristic;
   c. operating the environment chamber to set a first environment temperature, and acquiring a first value of the device characteristic from the measurement system;
   d. extracting a first temperature parameter set based on the first value of the device characteristic;
   e. operating the environment chamber to set a second environment temperature, and acquiring a second value of the device characteristic from the measurement system;
   f. extracting a second temperature parameter set based on the second value of the device characteristic, wherein each of the first and second temperature parameter sets comprise a temperature-dependent gain factor of a channel region of the device; and
   g. generating a temperature-scaling model for the device based on the first and second temperature parameter sets.

2. The method of claim 1, wherein the device exhibits non-monotomic behavior over a temperature range.

3. The method of claim 1, wherein the second environment temperature is below a transition temperature of the device.

4. The method of claim 3, wherein the device characteristic is temperature dependent.

5. The method of claim 1, wherein each of the first and second temperature parameter sets comprise a temperature-dependent power-on resistance of a drift region of the device.

6. The method of claim 5, wherein the temperature-dependent power-on resistance of a drift region of the device comprises a scaling coefficient and a temperature component.

7. The method of claim 1, wherein the temperature-dependent gain factor comprises a scaling coefficient and a temperature component.

8. The method of claim 3, wherein the second temperature is less than about 218° K.

9. The method of claim 3, wherein the first temperature is about room temperature.

10. The method of claim 9, further comprising the steps of:
   a. operating the environment chamber to set a third environment temperature, and acquiring a third value of the device characteristic from the measurement system;
   b. extracting a third temperature parameter set based on the third value of the device characteristic;
   c. operating the environment chamber to set a fourth environment temperature, and acquiring a fourth value of the device characteristic from the measurement system; and
   d. extracting a fourth temperature parameter set based on the fourth value of the device characteristic.

11. The method of claim 10, wherein the third temperature is an upper bound temperature.

12. The method of claim 11, wherein the fourth temperature is about equal to the transition temperature.

13. The method of claim 1, wherein the model comprises a modified probability density function of a Gumbel distribution in order to plot variance in the parameter sets.

14. The method of claim 13, further comprising the step of producing from the model an estimate of the device parameters over a temperature range from a low-end temperature at least as low as the second temperature to a high-end temperature at least as high as the fourth temperature.

15. The method of claim 14, wherein the low-end temperature is at least as low as about 93° K.

16. The method of claim 15, wherein the high-end temperature is at least as high as about 300° K.

17. The method of claim 16, wherein the model is accurate to within about 2% over the temperature range.

18. The method of claim 10, further comprising the step of determining the threshold temperature using the measurement system.

* * * * *